United States Patent [19]

Breed et al.

[11] 4,414,290
[45] Nov. 8, 1983

[54] MAGNETIC STRUCTURE SUITABLE FOR THE PROPAGATION OF SINGLE-WALLED MAGNETIC DOMAINS

[75] Inventors: Dirk J. Breed; Antonius B. Voermans, both of Eindhoven, Netherlands

[73] Assignee: U.S. Philips Corporation, New York, N.Y.

[21] Appl. No.: 358,062

[22] Filed: Mar. 15, 1982

Related U.S. Application Data

[63] Continuation of Ser. No. 130,889, Mar. 17, 1980, abandoned.

[30] Foreign Application Priority Data

Mar. 23, 1979 [NL] Netherlands .......................... 7902293

[51] Int. Cl.³ ............................................ G11C 11/02
[52] U.S. Cl. ...................................... 428/700; 365/33; 156/610; 156/621; 156/617 SP; 156/DIG. 63; 428/693; 428/900
[58] Field of Search ............... 428/900, 700, 692, 693; 365/33; 156/610, 621, 617 SP, DIG. 63

[56] References Cited

U.S. PATENT DOCUMENTS 4,138,530  2/1979  Breed et al. ......................... 428/900
4,202,930  5/1980  Kokta et al. ........................ 428/539

OTHER PUBLICATIONS

M. H. Rundles, Crystals, Growth, Properties & Applications, 1978, p. 86.

*Primary Examiner*—Ellis P. Robinson
*Attorney, Agent, or Firm*—Marc D. Schechter

[57] ABSTRACT

A magnetic structure in which magnetic domains can propagate. The structure comprises a monocrystalline gallium garnet substrate having a surface which is substantially parallel to a (100) crystal plane and on which a layer of rare-earth iron garnet, having a partial substitution of maganese ions in iron sites, is grown in compression. By using a substrate material having a lattice constant between 12.23 and 12.38 Å, the compression of a epilayer having certain desired magnetic properties can be adjusted by adjusting the incorporation of lutetium and yttrium ions in the epilayer, without adversely affecting magnetic properties of the layer.

7 Claims, 2 Drawing Figures

MAGNETIC STRUCTURE SUITABLE FOR THE PROPAGATION OF SINGLE-WALLED MAGNETIC DOMAINS

This is a continuation of application Ser. No. 130,889, filed Mar. 17, 1980 now abandoned.

BACKGROUND OF THE INVENTION

The invention relates to a magnetic structure in which single-walled magnetic domains can propagate. The structure comprises a monocrystalline nonmagnetic substrate having a surface bearing a layer of monocrystalline magnetic material consisting of a rare earth iron garnet having a partial substitution of $Mn^{3+}$ ions in iron sites. The layer is grown in compression on the substrate surface with an easy axis of magnetization substantially perpendicular to the plane of the layer and a medium axis of magnetization in the plane of the layer. The substrate surface is substantially parallel to a (110) crystal plane.

For generating and propagating single-walled magnetic domains, in particular cylindrical domains ("bubbles"), it is generally known to use a magnetic garnet material having an intrinsic uniaxial anisotropy and/or an induced uniaxial anisotropy (induced by stress or growth). This property is used for the formation of bubble domains by ensuring that an easy axis of magnetization is substantially perpendicular to the plane of the layer of the rare earth-iron garnet material. The term "rare earth" is to be understood herein as being an element having an atomic number of 39 or from 57 to 71 inclusive.

It is known from the article "New Bubble Materials With High Peak Velocity" by D. J. Breed at al. (IEEE Transactions on Magnetics, Vol. MAG 13, No. 3, September 1977, pp. 1087-1091) that in order to increase the velocity at which bubble domains can be propagated in garnet layers, garnet layers having an orthorhombic anisotropy have to be made. Layers having an orthorhombic anisotropy have an easy axis of magnetization perpendicular to the plane of the layer and hard axes of magnetization having two different degrees of "hardness" in the plane of the layer. These hard axes are often referred to as the "medium" axis and the "difficult" axis. The resulting anisotropy in the plane of the layer proves to have the same velocity-increasing effect as the known application of an external magnetic field acting in the plane of the layer. Such a field is, however, unsuitable for a number of bubble domain applications.

The above-mentioned article relates to bubble domain layers having an orthorhombic anisotropy grown in compression on gadolinium-gallium-garnet (GGG) substrates. The layers comprise manganese in some of the iron sites so as to obtain the desired magneto-structure properties. The required degree of compression is obtained by means of the choice of the rare earth ions. Since a layer of yttrium-iron garnet fits exactly on GGG, in order to provide a layer under compression a rare earth ion should be used which is larger than yttrium. However, magnetic properties such as the temperature dependence of the magnetization, are determined by the magnetic ions which are present at the iron sites and at the rare earth sites. This means that an yttrium iron garnet layer under compression on a GGG substrate cannot be obtained with a magnetic rare earth ion larger than yttrium, for example, gadolinium or europium, without, for example, influencing the temperature dependence of the magnetization. If, on the other hand, the compression of an yttrium iron garnet layer on GGG is to be obtained by means of a substituting nonmagnetic rare earth ion larger than yttrium, only lanthanum is available. It has been found, however, that lanthanum and manganese influence each other's incorporation in the layer so that the magneto-strictive properties are affected. In neither of the two cases is it thus possible to independently adjust the compression of an yttrium iron garnet epilayer on a GGG substrate.

In addition, the use of the magnetic rare earth ions gadolinium and europium for this purpose adversely adverse influences on the bubble-domain mobility (damping) while the overall magnetization is reduced. This is unfavorable for layers in which submicron bubble domains have to be generated and propagated.

SUMMARY OF THE INVENTION

It is an object of the invention to provide a magnetic structure, having a manganese-containing epilayer which is grown in compression on a nonmagnetic substrate, which maybe suitably compressed without adversely affecting the temperature dependence of the magnetization, the capability of carrying submicron bubble domains, or the bubble domain mobility.

The invention provides a magnetic structure suitable for the propagation of single-walled magnetic domains in the structure. The structure comprises a monocrystalline nonmagnetic substrate having a lattice constant between 12.23 and 12.38 Å and a layer of a monocrystalline, magnetic material consisting of a rare earth iron garnet having a partial substitution of $Mn^{3+}$ ions in iron sites. The magnetic layer has been grown in compression on a surface of the substrate with an easy axis of magnetization substantially perpendicular to the plane of the layer and a medium axis of magnetization in the plane of the layer. The surface of the substrate extends substantially parallel to a (110) crystal plane of the substrate.

By choosing a substrate material having a lattice parameter between 12.23 and 12.38 Å (yttrium gallium garnet, which has a lattice constant of 12.27 Å being an example of such a material), instead of GGG which has a lattice parameter of 12.383 Å, it is possible, for example, to use a lutetium iron garnet layer as the epilayer, Lutetium iron garnet fits exactly on yttrium gallium garnet. In order to be able to grow a layer of a material based on lutetium iron garnet in compression on such an yttrium gallium garnet substrate, a rare earth ion should be incorporated in the lutetium iron garnet which is larger than lutetium. Yttrium is very suitable for this purpose as it is nonmagnetic and hence does not influence the temperature dependence of the magnetization of the layer. Further, yttrium does not impede the realization of a material capable of carrying submicron domains and moreover it does not influence the bubble-domain mobility.

In addition to yttrium gallium garnet, nonmagnetic garnet substrate materials satisfying the requirement of the invention include, inter alia, terbium gallium garnet (lattice constant 12.35 Å), dysprosium gallium garnet (lattice constant 12.31 Å) and calcium gallium germanium garnet (lattice constant 12.25 Å). On the last-mentioned substrate material, layers based on lutetium iron garnet could be grown in compression without incorporating yttrium.

The invention also relates to a magnetic bubble device comprising a magnetic structure according to the invention. In the structure the magnetic layer is provided with a pattern which defines propagation elements. The device further comprises a source capable of producing a magnetic field for maintaining magnetic bubbles in the magnetic layer and electromagnetic means for producing a propagation field.

BRIEF DESCRIPTION OF THE DRAWING

An embodiment of such a magnetic device will now be described with reference to the drawing.

DESCRIPTION OF THE PREFERRED EMBODIMENTS

Figure 1:
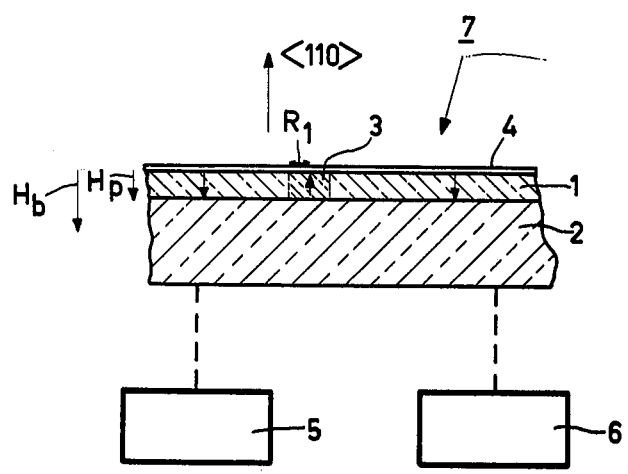
FIG. 1 is a schematic side sectional elevation of a magnetic bubble domain device comprising a magnetic structure according to the invention.

Single crystals of $Y_3Ga_5O_{12}$ may be prepared by a Czochralski method similar to a method described for $Gd_3Ga_5O_{12}$. (See, for example, O'Kane, Sadagopan and Giess, "Crystal Growth and Characterization of Gadolinium Gallium Garnet," Journal of the Electrochem Soc., Vol. 120 1973 pp. 1272-1275).

Single crystals of $Y_3Ga_5O_{12}$ were prepared using starting materials having a purity better than 99.99% and were dried by firing at 1000° C. for 12 hours. The dried powders were stored in a desiccator before being weighed in the correct ratio. After weighing, the powders were mixed and formed into pills. A crucible, consisting of a round tray of iridium, was completely filled with the pills. The crucible was heated to melt the pills, cooled, replenished with pills and heated again. This must be done as few times as possible to spare the crucible. The crucible was then placed in a drawing apparatus, insulated against heat irradiation. The crucible was heated to just above the melting point of the $Y_3Ga_5O_{12}$ by means of a high frequency induction generator. A well directed seed, in this case having a $<110>$ orientation was lowered so that it just touched the melting surface. The powder output of the generator was accurately readjusted so that the seed did not melt and did not grow. Drawing of the seed was then started, while rotating the seed, using a drawing rate $<5$ mm/hour. The speed of rotation was adjusted to 60 cycles per minute so that the crystal, when it had grown to its ultimate diameter, had a substatially flat solidification front. The growth was then controlled automatically by means of a weighing device so as to keep the diameter of the growing crystal constant. The process was terminated by significantly increasing the drawing rate. The power output of the generator was reduced to zero and the crystal was subsequently removed from the apparatus.

The gas atmosphere in the apparatus during crystal growth consisted of a mixture of $N_2$ and $O_2$ containing 2% by volume of $O_2$. This composition was chosen as an optimum compromise between annoying $Ga_2O$ evaporation and oxidation of the crucible without evaporation of $IrO_3$.

In order to produce stoichiometric $Y_3Ga_5O_{12}$, it is necessary to use a starting mixture in which the molecular ratio $Y_2O_3/Ga_2O_3$ is 3.1:4.9 (Brandle and Barns, Journal of Crystal growth, 26 (1974) p. 169).

A bubble domain layer 1 (FIG. 1) can be grown epitaxially on a substrate 2 by, for example, chemical vapor deposition (CVD) or by liquid phase epitaxy (LPE). LPE is very suitable for the growth of garnet layers having an easy axis of magnetization which is normal to the plane of the layer.

The LPE growth occurs as follows. A platinum crucible having a capacity of, for example, 100 cc, was placed in a furnace, the crucible containing a $PbO$-$B_2O_3$ melt in which the required oxides for the growth of the layer are dissolved. The contents of the crucible were heated above the saturation temperature of the melt and were stirred, then the melt was cooled to the growth temperature. An yttrium gallium garnet substrate, sawned and polished in an orientation which provides a desired deposition surface, was placed in a platinum holder and was dipped in the melt for a certain period of time. Either the vertical or the horizontal dipping method may be used. When the thickness of the layer grown on the substrate was sufficient, the substrate was drawn out of the melt. Flux residues, if any, may be removed by means of a mixture of dilute nitric acid and dilute acetic acid.

A number of layers which satisfied the general composition:

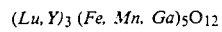

were grown in the above-described manner.

Initially, this composition was chosen because it was easy to grow for the purpose of the invention.

A characteristic embodiment of the growth of a layer on the basis of the above-mentioned composition is described in Example 1.

EXAMPLE 1

For the growth, on a yttrium gallium garnet substrate, of a layer having a composition of the general type

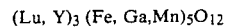

a melt was proposed consisting of the following constituents.

| | |
|---:|:---|
| 1200 g | PbO |
| 25 g | $B_2O_3$ |
| 100 g | $Fe_2O_3$ |
| 16 g | $MnCO_3$ |
| 3.75 g | $Y_2O_3$ |
| 9 g | $Lu_2O_3$ |
| 15 g | $Ga_2O_3$ |

The substrate provided a deposition surface which was misoriented 2° relative to a (110) plane. The substrate was dipped horizontally in the melt for 1 minute and 50 seconds at 933° C. The substrate was rotated about a vertical axis at 120 rpm, the direction of rotation being reversed after every 5 rotations. A substrate having a small misorientation of the deposition surface relative to a (110) plane was necessary to obtain a sufficiently smooth layer when a lead flux is used. The thickness of the grown layer was 2.16 μm, the "misfit", $(a_1-a_2)/a_1$ being $-1.6 \times 10^{-3}$ where $a_1$ is the lattice parameter of the substrate material and $a_2$ is the lattice parameter of the layer material. The following magnetic properties were measured.

| | |
|---|---|
| $4\pi M_s$ | = 300 Gauss |
| B(strip width) | = 2.05 μm |

-continued

| | |
|---|---|
| $H_{collapse}$ | = 160 Oe. |

A series of experiments relating to the growth of layers on the basis of the general composition (Lu, Y, Gd)$_3$ (Fe, Mn, Ga)$_5$O$_{12}$ on a surface of an yttrium gallium garnet substrate misoriented 2° relative to a (110) plane is described in Example 2.

EXAMPLE 2

For the growth process which took place in a similar manner to that described in Example 1, a melt was prepared which consisted of the following constituents.

| | |
|---|---|
| 1320 g | PbO |
| 25.5 g | B$_2$O$_3$ |
| 120 g | Fe$_2$O$_3$ |
| 3.75 g | Y$_2$O$_3$ |
| 9.25 g | Lu$_2$O$_3$ |
| 16.0 g | MnCO$_3$ |
| 16.0 g | Ga$_2$O$_3$ |

The growth temperature was 947° C. A 4.2 μm thick layer was grown in 3 minutes and showed a "misfit" of $-3.3 \times 10^{-3}$.

The following magnetic properties were measured.

| | |
|---|---|
| $4\pi M_s$ | = 252 Gauss |
| B(strip width) | = 3.67 μm |
| $H_{collaps}$ | = 141 Oe |
| $K_u(00\bar{1})$ | = 1.65 × 10$^4$ |
| $\Delta(110)$ | = −2.86 × 10$^4$ |
| $Q_1 = \dfrac{K_u}{2\pi M_s^2}$ | = 7.14 |
| $Q_2 = \dfrac{\Delta}{2\pi M_s^2}$ | = 12.3 |

Figure 2:
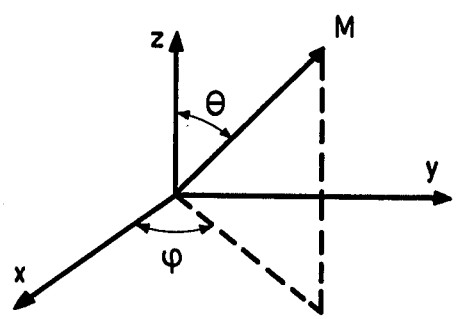
FIG. 2 shows a system of coordinates with reference to which orthorhombic anisotropy is defined.

FIG. 2 shows a system of coordinates with reference to which the orthorhombic anisotropy is usually defined.

The magnetic anisotropy energy F of the system may be written as $$F = K_u \sin^2 \theta + \Delta \sin^2 \theta \sin^2 \rho$$

$K_u$ represents the difference in energy between the easy axis z and the medium axis x, while $\Delta$ represents the difference in energy between the medium axis x and the hard axis y. $\theta$ and $\rho$ denote the orientation of the magnetization.

The domain wall velocity was measured by means of the so-called "bubble collapse" technique (see A. H. Bobeck et al, Proceedings 1970 Ferrites, Conference, Kyoto, Japan, page 361). In this method a bias field $H_b$ (FIG. 1) is produced by a bias field source. The bias field which is necessary for forming a stable bubble domain 3, is increased by means of a field pulse $H_p$ in such a manner that the total field has a value which exceeds the static collapse field. During the field pulse, the radius of the bubble domain 3 decreases from its original value $R_1$ to a smaller value $R_2$ which is determined by the width of the pulse. If at the instant the pulse field $H_p$ is switched off, the radius $R_2$ of the bubble domain is larger than the radius $R_0$ at which it becomes unstable, the bubble domain will expand again until it has reached its original radius $R_1$. If at the instant the pulse field is switched off $R_2$ is smaller than $R_0$, the bubble domain will start shrinking (collapsing) and it will finally disappear. Associated with a given pulse amplitude is a critical pulse width at which $R_2$ is exactly equal to $R_0$. This pulse width is termed the bubble domain collapse time $\tau$. The domain wall velocity is then defined by $\Delta R/\tau$, where $\Delta R = R_1 - R_0$.

Further characteristics of bubble domain device 7, schematically shown in FIG. 1, are a layer 4 which defines a bubble propagation pattern and electromagnetic means 6 for producing a bubble propagation field.

What is claimed is:

1. A magnetic structure, in which single-walled magnetic domains can be propagated, comprising:
    a monocrystalline, nonmagnetic substrate having a surface extending substantially parallel to a (110) plane of the crystal; and
    a monocrystalline layer of a magnetic rare-earth iron garnet, having a partial substitution of Mn$^{3+}$ ions at iron sites, said layer being substantially planar and having been grown under compression on the surface of the substrate, said layer having an easy axis of magnetization substantially perpendicular to the plane of the layer and having a medium axis of magnetization in the plane of the layer;
    characterized in that:
    the substrate has a lattice constant between 12.23 and 12.38 Å; and
    the magnetic layer consists essentially of a material having the formula $(Lu_xY_zR_{1-x-z})_3Fe_{5-y}Mn_yO_{12}$, where R is at least one rare earth ion which is larger than a Lu ion, $0 < x < 1$, $0 < z < 1$, and y is $\geq 0.15$.

2. A magnetic structure, in which single-walled magnetic domains can be propagated, comprising:
    a monocrystalline, nonmagnetic substrate having a surface extending substantially parallel to a (110) plane of the crystal; and
    a monocrystalline layer of a magnetic rare-earth iron garnet, having a partial substitution of Mn$^{3+}$ ions at iron sites, said layer being substantially planar and having been grown under compression on the surface of the substrate, said layer having an easy axis of magnetization substantially perpendicular to the plane of the layer and having a medium axis of magnetization in the plane of the layer;
    characterized in that:
    the substrate is calcium-gallium-germanium garnet having a lattice constant of 12.25 Å; and
    the magnetic layer consists essentially of a material having the formula $Lu_3Fe_{5-y}Mn_yO_{12}$, where $y \geq 0.15$.

3. A magnetic bubble device comprising:
    a monocrystalline, nonmagnetic substrate having a surface extending substantially parallel to a (110) plane of the crystal;
    a monocrystalline layer of a magnetic rare earth-iron garnet having a partial substitution of Mn$^{3+}$ ions at iron sites, said layer being substantially planar and having been grown under compression on the surface of the substrate, said layer having an easy axis of magnetization substantially perpendicular to the plane of the layer and having a medium axis of magnetization in the plane of the layer;

a pattern of propagation elements on the magnetic layer;

means for producing a magnetic field for maintaining magnetic bubbles in the magnetic layer; and means for producing a propagation field for propagating the magnetic bubbles in the magnetic layer; characterized in that:

the substrate has a lattice constant between 12.23 and 12.38 Å; and the magnetic layer consists essentially of a material having the formula $$(Lu_xY_zR_{1-x-z})_3Fe_{5-y}Mn_yO_{12},$$

where R is at least one rare earth ion which is larger than a Lu ion, $0<x<1$, $0<z<1$, and y is $>0.15$.

4. A magnetic structure as claimed in claim 1, characterized in that the substrate material is yttrium-gallium garnet, having a lattice constant of 12.27 Å.

5. A magnetic structure as claimed in claim 1, characterized in that the substrate material is terbium-gallium garnet, having a lattice constant of 12.35 Å.

6. A magnetic structure as claimed in claim 1, characterized in that the substrate material is dysprosium-gallium garnet, having a lattice constant of 12.31 Å.

7. A magnetic structure as in claim 1, characterized in that the substrate material is calcium-gallium-germanium garnet, having a lattice constant of 12.25 Å.

* * * * *